(12) United States Patent
Wang et al.

(10) Patent No.: US 6,844,250 B1
(45) Date of Patent: Jan. 18, 2005

(54) METHOD AND SYSTEM FOR LASER THERMAL PROCESSING OF SEMICONDUCTOR DEVICES

(75) Inventors: Yun Wang, San Jose, CA (US); Shaoyin Chen, San Jose, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 10/390,504

(22) Filed: Mar. 13, 2003

(51) Int. Cl.[7] .............................................. H01L 21/26
(52) U.S. Cl. ...................................................... 438/535
(58) Field of Search ............................... 438/519–522, 438/528–530, 532, 535, 542, 585, 591, FOR 242, FOR 334, FOR 418, FOR 419, 162, 166, 197, 295, 299, 301, 303, 305, 306–308, 511, 514

(56) References Cited

U.S. PATENT DOCUMENTS

| | | | | |
|---|---|---|---|---|
| 5,930,617 A | * | 7/1999 | Wu | 438/233 |
| 6,368,947 B1 | * | 4/2002 | Yu | 438/530 |
| 6,521,501 B1 | * | 2/2003 | Erhardt et al. | 438/305 |
| 6,548,361 B1 | * | 4/2003 | En et al. | 438/301 |

OTHER PUBLICATIONS

Wolf et al. (Silicon Processing for the VLSI Era, vol. 2–Process integration, pp 318, 1990).*

* cited by examiner

*Primary Examiner*—George Fourson
*Assistant Examiner*—Brook Kebede
(74) *Attorney, Agent, or Firm*—Allston L. Jones

(57) ABSTRACT

Methods and systems for performing laser thermal processing (LTP) of semiconductor devices are disclosed. The method includes forming a dielectric cap atop a temperature-sensitive element, and then forming an absorber layer atop the dielectric layer. A switch layer may optionally be formed atop the absorber layer. The dielectric cap thermally isolates the temperature-sensitive element from the absorber layer. This allows less-temperature-sensitive regions such as unactivated source and drain regions to be heated sufficiently to activate these regions during LTP via melting and recrystallization of the regions, while simultaneously preventing melting of the temperature-sensitive element, such as a poly-gate.

31 Claims, 6 Drawing Sheets

METHOD AND SYSTEM FOR LASER THERMAL PROCESSING OF SEMICONDUCTOR DEVICES

BACKGROUND OF THE INVENTION

1. Field of the Invention

The present invention relates to laser thermal processing, and in particular relates to laser thermal processing in the formation of semiconductor devices.

2. Description of the Prior Art

Laser thermal processing (LTP) utilizes short pulses of laser radiation to thermally anneal and activate the dopants in semiconductors as part of the process of forming a semiconductor device, such as a metal oxide semiconductor (MOS) device. LTP is described in U.S. Pat. Nos. 5,908,307, 6,366,308 and 6,365,476, which patents are incorporated by reference herein. Dopant activation via LTP is achieved by melting a thin layer of semiconductor material to diffuse the dopants within the molten region. During cooling, the molten material re-crystallizes, fixing the dopants into the lattice sites where they remain electrically active.

The LTP technique can be used to form junctions in source and drain extension regions of a field-effect transistor (FET). The LTP-formed junctions have desirable characteristics, i.e., they are shallow, abrupt, and have low resistance. In addition, because of the extremely high heating and cooling rates involved in LTP ($10^6$–$10^{12}$ Kelvin/sec), a meta-stable state can be established wherein dopant activation occurs above the solid-solubility limit. These properties allow a transistor to be scaled to a smaller dimension with improved performance.

In LTP, it is important to uniformly heat the structure being processed. To achieve uniform LTP heating of a MOS devices, a "switch layer" may be employed. A reflectivity-based switch layer is described in U.S. Pat. Nos. 6,303,476 and 6,383,956, which patents are incorporated by reference herein. A phase-based switch layer is described in U.S. Pat. No. 6,479,821, which patent is incorporated by reference herein.

FIG. 1 is a cross-sectional view of a prior art LTP structure 8 as formed on a silicon substrate 10 having a crystalline region 12 and an amorphous silicon layer (junction) 14 atop the crystalline region. LTP structure 8 includes a thin dielectric (e.g., silicon dioxide) layer 20 that resides atop amorphous silicon junction 14., LTP structure 8 also includes an absorber layer 24 (e.g., a metal layer such as titanium) that resides atop dielectric layer 20. Further, in the example embodiment shown, LTP structure 8 includes an optional switch layer 30 that resides atop the metal layer. Switch layer 30 has a transition temperature at which the layer changes its state.

Optional switch layer 30 is either a reflectivity-switch layer or a phase-switch layer. For a reflectivity-switch layer, the reflectivity of the switch layer increases dramatically when the switch occurs. Thus, LTP radiation that is transmitted by the switch while in the first state is reflected in the second state. An example material for a reflectivity-switch layer is polysilicon, which has a melting temperature about 200° C. higher than amorphous silicon.

For a phase-switch layer, the absorption of the layer changes dramatically when the switch occurs but the layer does not heat significantly due to a high latent heat of melting or vaporization. Thus, LTP radiation that is transmitted by the switch layer while in the first state is absorbed by the switch layer in the second state without increasing the temperature of the switch layer due to the latent heat of vaporization or melting. An example material for a phase-switch layer is aluminum arsenide, or layers of silicon dioxide and polyimide.

Dielectric layer 20 serves as a metal diffusion barrier, and also prevents metal from reacting with silicon junction 14. Absorber layer 24 serves to absorb laser radiation 40 and transfer heat to silicon junction 14, as well as to switch layer 30.

Switch layer 30 is used to regulate the junction temperature when structure 8 is irradiated with laser radiation 40. When structure 8 is first irradiated, the temperatures of switch layer 30 and junction 14 rise due to the heat emitted by absorber layer 24. When the temperature of junction 14 reaches its melting temperature (i.e., the melting temperature of amorphous silicon), the junction starts melting. When the temperature of switch layer 30 reaches its transition temperature, radiation 40 is substantially prevented from reaching absorber layer 24 by virtue of the change of the state of the switch layer (e.g., changing from low reflectivity to high reflectivity, or from low absorption to high absorption).

Therefore, the temperature of junction temperature 14 is prevented from exceeding the melting temperature of crystalline substrate 10, which needs to remain crystalline in order to maintain the integrity of structure 8.

The use of structure 8 makes LTP much easier to perform, i.e., it provides a greater process latitude. However, on certain types of device wafers, the upper limit of the process window is restricted by the possibility of melting select temperature-sensitive elements in the device. For example, in the case of a MOS transistor, the polysilicon gate ("poly-gate") that resides atop the field oxide can melt, especially if a switch layer also made of polysilicon is employed. After melting and recrystallization using LTP processing, the poly-gate may deform and become incapable of performing its required function in the device.

Accordingly, there are two main requirements for performing LTP when forming certain types of IC devices, such as MOS transistors: (1) doped amorphous regions(s) need to be heated to their melting temperature, but not to a temperature higher than the crystal silicon melt temperature; and (2) any temperature-sensitive elements (e.g., poly-gates) cannot be heated to their melting temperature, and should be kept below their melting temperature.

Unfortunately, in the prior art process and structure described above in connection with FIG. 1, the amount of heat required to melt and activate the junction is often very close to the amount of heat needed to melt a temperature-sensitive element such as a poly-gate. The result is a relatively small LTP process window.

In forming a CMOS device, amorphization and dopant implant steps are performed to form the source and drain regions (extensions). But in the usual self-aligned source-drain formation process, the upper portion of the poly-gate will also be amorphized and/or doped during the implantation process to the same extent as the source and drains. Thus, the upper portion of the poly-gate also melts when the source and drain regions melt during LTP. This melting could deform the poly-gate, which typically ruins the device.

To fabricate devices such as MOSFETs and other types of integrated circuits (ICs) using LTP, it is highly desirable to keep the poly-gate temperature low and to prevent the amorphization of the polygate in order to preserve the poly-gate integrity.

SUMMARY OF THE INVENTION

An aspect of the invention is a system for performing LTP of a semiconductor structure that includes a substrate and a temperature-sensitive element, such as a poly-gate of a transistor. The system comprises a dielectric cap formed atop the temperature-sensitive element. An absorber layer is formed atop the substrate and the dielectric cap. The dielectric cap is adapted to insulate the temperature-sensitive element from heat transmitted by the absorber layer during LTP to prevent melting of the temperature-sensitive element. The dielectric cap may also be formed to substantially prevent implantation particles from reaching the temperature-sensitive element during an implantation process, e.g., an amorphization or dopant implant. A further aspect of the invention includes a switch layer formed atop the absorber layer. The switch layer is either a reflectivity-switch layer or a phase-switch layer.

Another aspect of the invention is a method of forming a semiconductor structure for performing laser thermal processing (LTP) that is particularly applicable when forming a semiconductor device that includes a substrate and a temperature-sensitive element such as a polygate. The method includes forming a dielectric cap atop the temperature-sensitive element such that the dielectric cap insulates the temperature-sensitive element from heat transmitted by an absorber layer formed over the dielectric cap. The dielectric cap may also be formed to be capable of substantially preventing implantation particles from reaching the underlying temperature-sensitive element during an implantation process, e.g., an amorphization or dopant implant. The method also includes forming an absorber layer atop the substrate and the dielectric cap. A further aspect of the invention includes forming either a reflectivity-switch layer or a phase-switch layer atop the absorber layer.

DETAILED DESCRIPTION OF THE INVENTION

Figure 1:
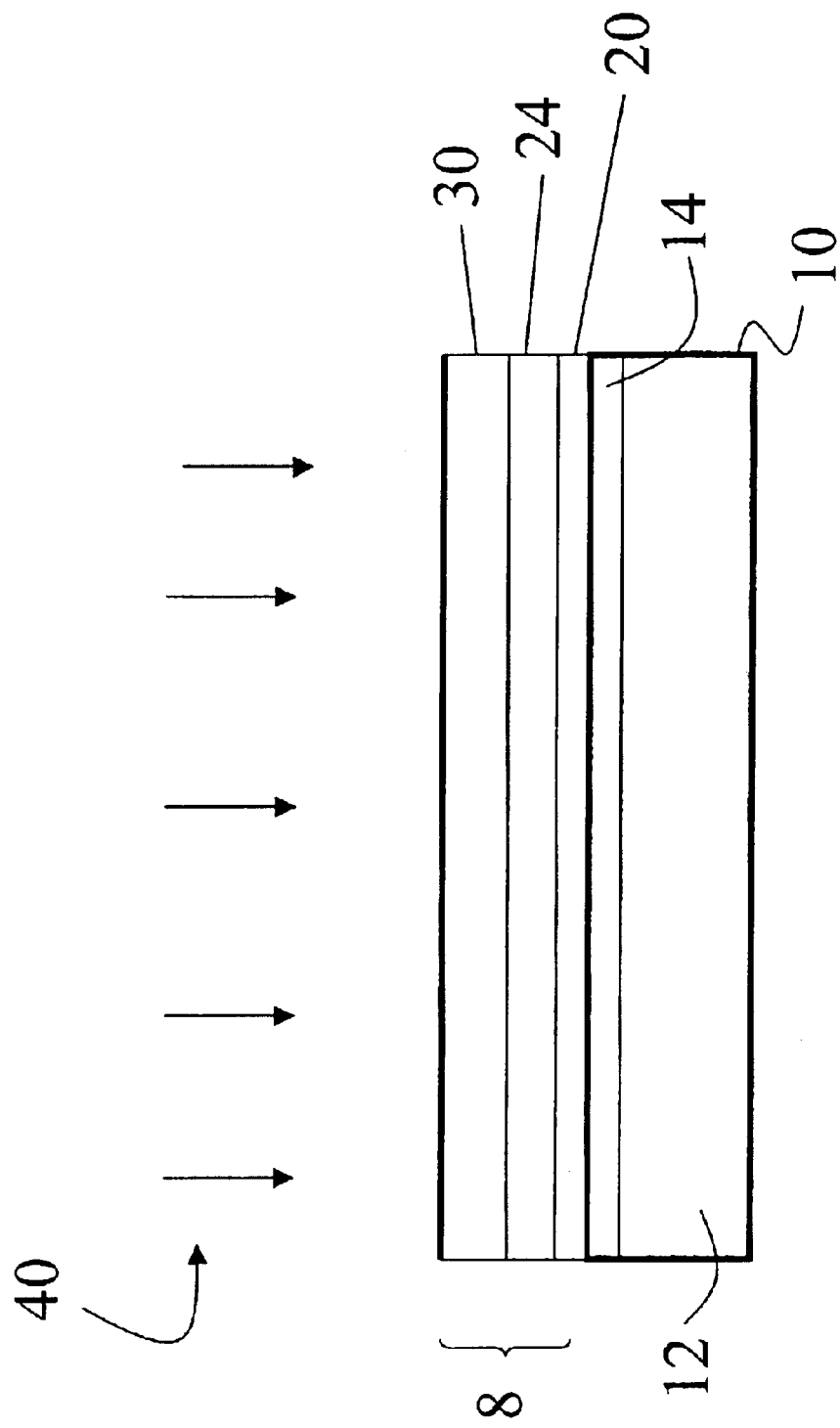
FIG. 1 is a cross-sectional view of a prior art LTP structure formed atop a substrate, as used to uniformize and regulate the heating of a junction structure during LTP.

In the following detailed description of the invention, reference is made to the accompanying drawings, which form a part hereof, and in which is shown, by way of illustration, specific embodiments in which the invention may be practiced.

In the drawings, like numerals describe substantially similar components throughout the several views. The embodiments are described in sufficient detail to enable those skilled in the art to practice the invention. Other embodiments may be utilized, and structural or processes changes may be made without departing from the scope of the present invention.

The terms wafer and substrate used in the following description include any structure having an exposed surface with which to form the integrated circuit (IC) structure of the invention. The term substrate is understood to include semiconductor wafers. Both wafer and substrate include doped and undoped semiconductors, epitaxial semiconductor layers supported by a base semiconductor or insulator, as well as other semiconductor structures well known to one skilled in the art.

The present invention is a method and system that allows for LTP to be more easily carried out to form select semiconductor devices, such as CMOS devices. The method and system provide for an improved (i.e., larger) LTP process window. In the case of forming a CMOSFET, this is achieved by subjecting temperature-sensitive polygate to less heat than the less-temperature-sensitive region(s) to be activated during LTP.

The invention is described below in connection with forming a CMOSFET device for the sake of convenience and illustration. However, it will be apparent to those skilled in the art that the invention applies to other semiconductor devices that have temperature-sensitive elements besides poly-gates that need to be insulated from the heat generated during LTP, e.g., polysilicon runners and/or polysilicon pads in isolation regions. The invention uses conventional CMOS process techniques, such as described in a book by Yuan Taur, entitled "Fundamentals of Modern VLSI Devices," Cambridge University Press, 1998, which is incorporated herein by reference.

Figure 2A:
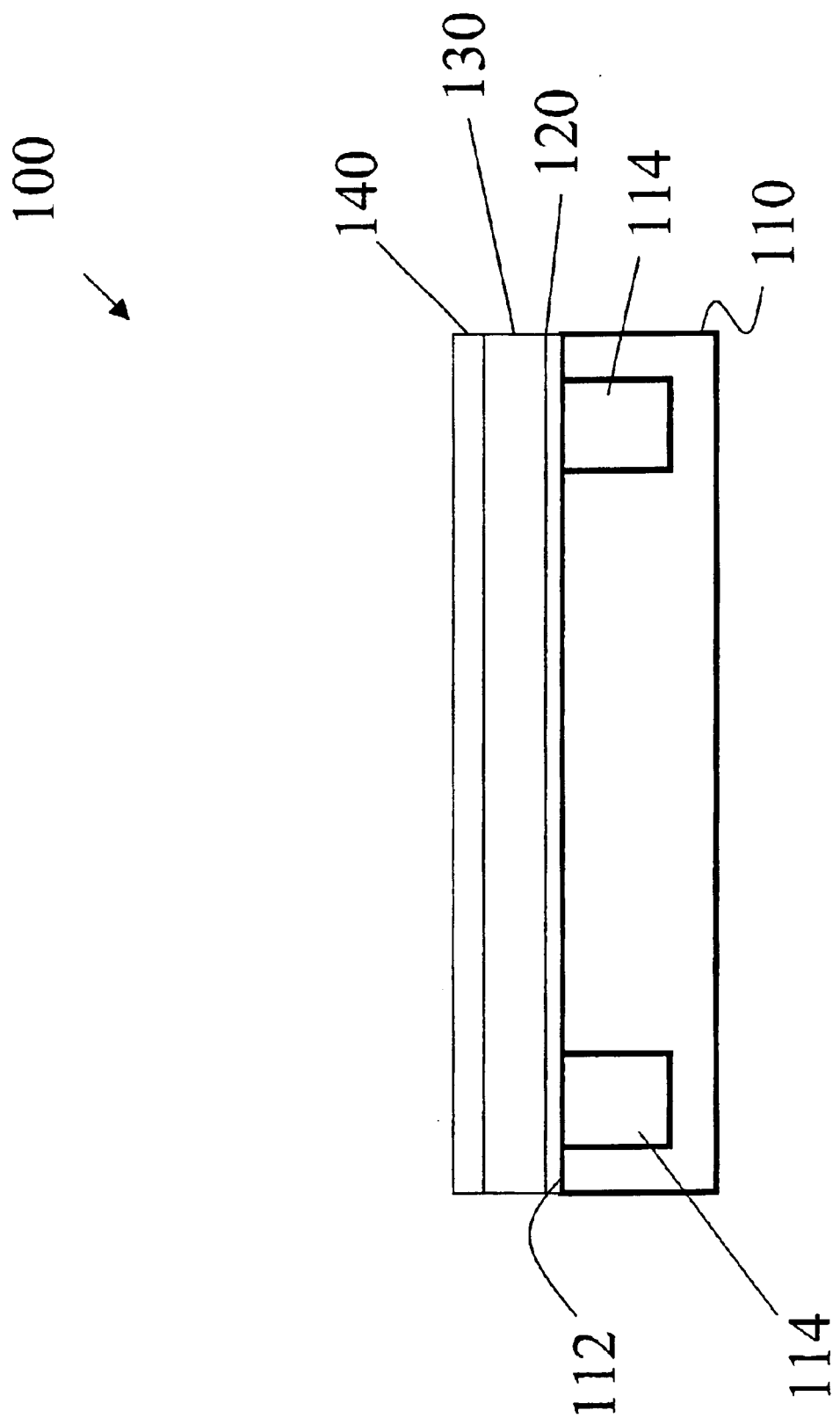
FIG. 2A is a cross-sectional view of an example embodiment of a semiconductor structure of the present invention in its initial phase, as part of the process of forming an example IC device in the form of a CMOSFET.

FIG. 2A is a cross-sectional view of an example embodiment of a semiconductor structure 100 in its initial phase as part of the process of forming a CMOSFET device. Structure 100 includes a crystalline silicon substrate (wafer) 110 having an upper surface 112. Shallow trench isolation members 114 are formed in substrate 110. A thin gate dielectric layer 120 is formed atop the substrate, and a polysilicon layer 130 is formed atop the gate dielectric layer. A dielectric layer 140 is formed atop the polysilicon layer. Dielectric layer 140 preferably has low thermal conductivity and low transmission of implanted atomic or ionic particles (e.g., dopants) so that it can serve as an effective barrier (mask) when performing an implantation. In other words, the dielectric layer substantially prevents implanted particles from passing through to the polysilicon layer below when a particle implantation (e.g., for dopant implanting or amorphization) is performed on the structure. Example materials suitable for dielectric layer 140 include silicon oxide, silicon oxynitride, and silicon nitride. In an example embodiment, the thickness of dielectric layer 140 is between 5 nm and 50 nm. The maximum thickness of dielectric layer 140 is determined in large measure by the ability to successfully remove remaining portions of the dielectric layer (as discussed further below) without damaging other parts of the semiconductor device being fabricated.

In an example embodiment, polysilicon layer 130 is pre-doped before the formation of dielectric layer 140. The pre-doping can be done by in-situ doping (dopant incorporated during layer deposition) or ion implantation. In conventional CMOS process, the poly-gate dopant is introduced at a later stage when source and drain are implanted. However, in the present invention the conventional CMOS doping is not effective because the addition of the dielectric layer will block the dopant from entering the poly-gate. Therefore poly-gate pre-doping is necessary.

Figure 2B:
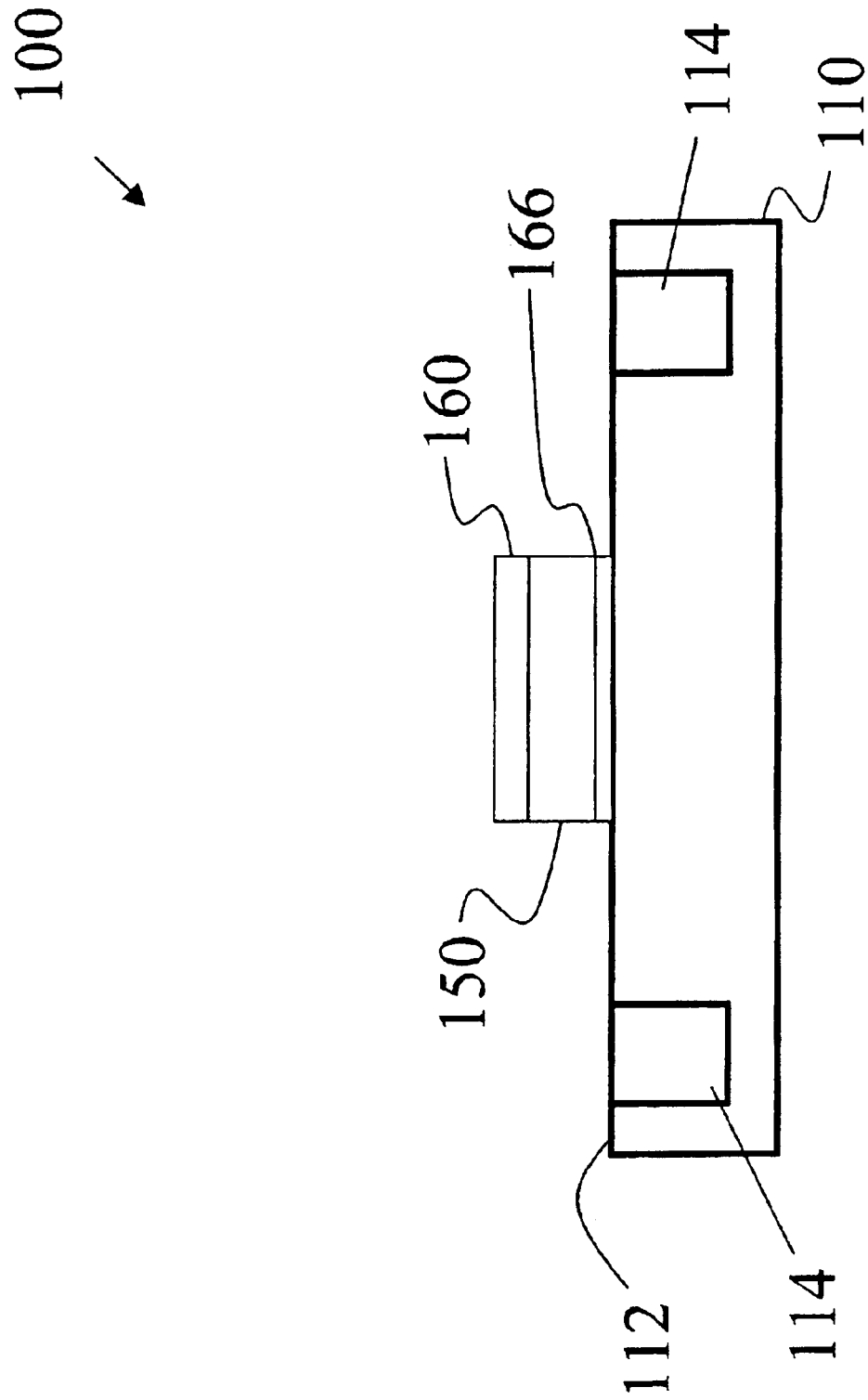
FIG. 2B shows the structure of FIG. 2A, further processed to form a poly-gate having a dielectric cap formed thereon.

FIG. 2B shows the structure of FIG. 2A, further processed (e.g., masked and anisotropically etched) to form a polysilicon element 150 in the form of a poly-gate, referred to hereinafter simply as "poly-gate 150" for the sake of convenience.

A portion (cap) 160 of dielectric layer 140 is formed atop the poly-gate during the formation of the polygate. A portion 166 of gate oxide layer 120 separates the poly-gate from the substrate upper surface 112. Portion 166 is referred to hereinafter as "gate oxide 166."

Figure 2C:
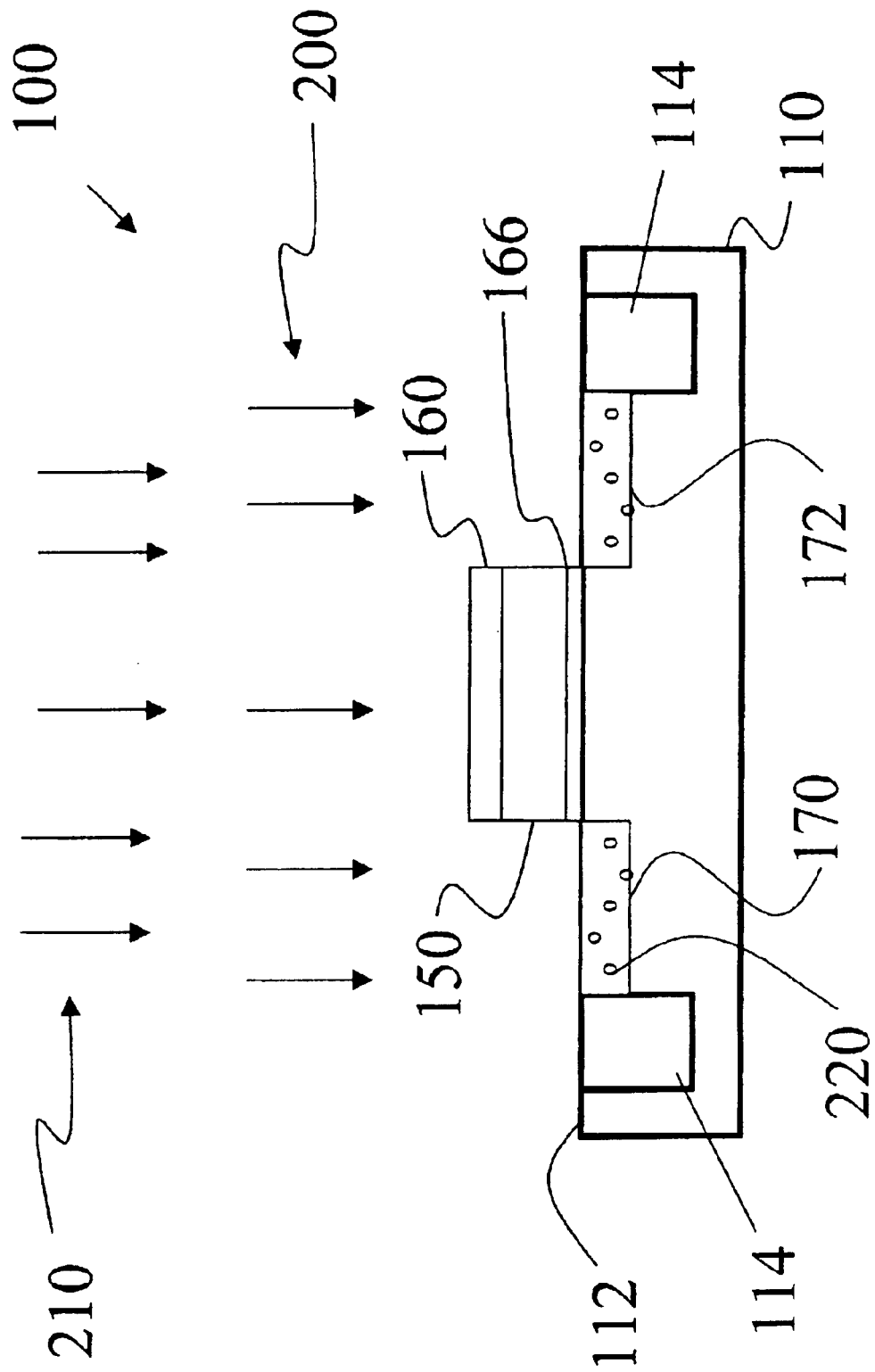
FIG. 2C shows the structure of FIG. 2B, further processed to form self-aligned amorphized regions (extensions) in the substrate adjacent the poly-gate, in anticipation of forming corresponding source and drain regions (extensions)

FIG. 2C shows the structure of FIG. 2B, further processed to form self-aligned amorphized regions (i.e., extensions) 170 and 172 in substrate 110 adjacent gate 150, in anticipation of forming corresponding source and drain regions (i.e., extensions). This processing includes, for example, performing an amorphizing implant 200 to form amorphized regions 170 and 172, and then performing a dopant implant 210 to implant dopants 220 into the amorphized regions.

Figure 2D:
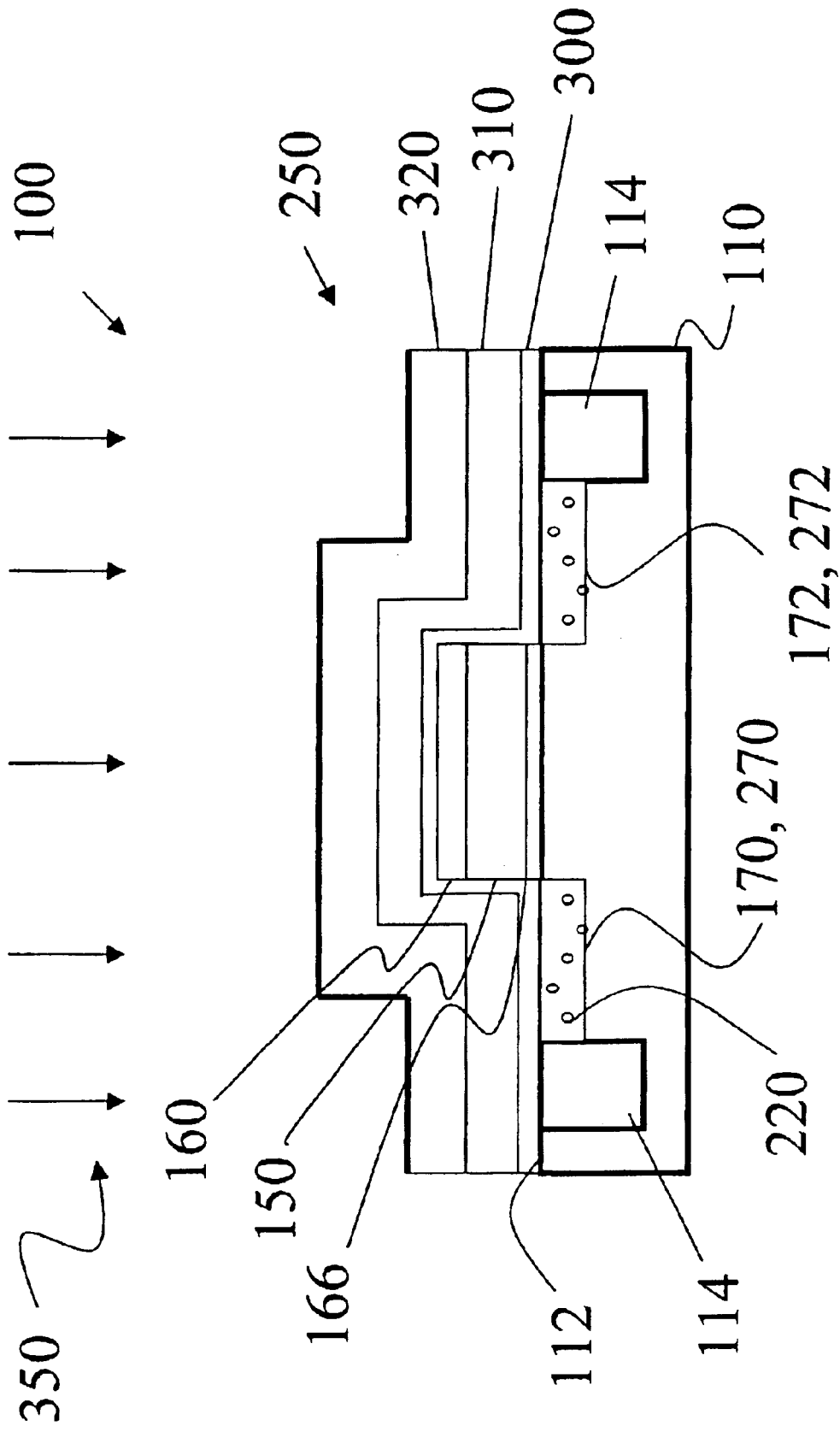
FIG. 2D shows the structure of FIG. 2C, further processed to include an embodiment of an improved LTP structure ("system") for carrying out LTP to activate dopants in the amorphized regions to form corresponding source and drain regions.

FIG. 2D shows the structure of FIG. 2C, further processed to include an improved LTP structure ("system") 250 for carrying out LTP, and in particular to activate dopants 220 to form source and drain regions 270 and 272. LTP structure 250 includes a thin dielectric barrier layer 300 formed conformally over the entire structure (source, drain and gate regions 270, 272, and 150). In an example embodiment, dielectric barrier layer 300 is an oxide such as silicon dioxide. Further, dielectric barrier layer 300 is relatively thin to reduce the thermal resistance to source drain areas. In an example embodiment, the thickness of dielectric barrier layer 300 is 5 to 15 nm. LTP system 250 further includes an absorber layer 310 formed atop the dielectric barrier layer and over dielectric cap 160.

In an example embodiment, absorber layer 310 is a metal, such as titanium, capable of absorbing radiation and transmitting heat to the remainder of the structure below.

In another example embodiment, system 250 optionally Includes a switch layer 320 formed atop absorber layer 310. Switch layer 320 is particularly useful in cases where it is difficult to control the LTP radiation to prevent melting of poly-gate 150 during the LTP process. The use of switch layer 320 provides greater latitude in the LTP process by terminating the heating of the structure even when the LTP radiation remains incident on the structure. Thus, less control over the energy per radiation pulse and the temporal duration of the pulse is required. In one example embodiment, switch layer 320 is a reflectivity-based switch, while in another example embodiment, the switch layer is a phase-based switch.

With continuing reference to FIG. 2D, the method of operation of LTP system 250 is now described. In operation, structure 250 is irradiated with pulsed laser radiation 350, which is absorbed by absorber layer 310. In the embodiment where switch layer 320 is present, most of radiation 350 passes through the switch layer and is absorbed by absorber layer 310.

The heated absorber layer 310 then transmits heat through dielectric barrier layer 300 to the doped, amorphous regions 170 and 172. Absorber layer 310 also transmits heat to switch layer 320, if present, and to dielectric cap 160. However, dielectric cap 160 is relatively thick compared to the thin barrier dielectric layer 300. Because of the poor thermal conductivity of dielectric cap 160, poly-gate 150 is thermally insulated from a large portion of the heat transmitted by the absorber layer. This, in effect, maintains the temperature of poly-gate 150 below the melting temperature of polysilicon while the doped amorphous silicon regions 170 and 172 are heated to their melting temperature.

Moreover, in an example embodiment, dielectric cap 160 is made sufficiently thick so that particle implanting (e.g., for amorphization or doping) does not result in particle implantation of the poly-gate. Thus, the poly-gate is protected not only from degradation due to heating, but also from degradation due to particle implantation processes. As mentioned above, if the upper portion of poly-gate 150 is amorphized during an amorphization implantation, it will lower the poly-gate melting temperature for the upper portion, making the poly-gate more susceptible to melting during LTP.

In the example embodiment of the present invention that does not utilize switch layer 320, the irradiation process is terminated at the point when the doped amorphous silicon regions 170 and 172 are melted so that they can quickly recrystallize to form activated regions 270 and 272.

In the example embodiment of the present invention where optional switch layer 320 is utilized, absorber layer 310 also heats the switch layer to its transition temperature, at which point the transmission of radiation 350 through the switch layer is greatly reduced. This allows for the doped amorphous silicon regions 170 and 172 to rapidly recrystallize to form activated source and drain regions 270 and 272 even while radiation 350 is incident on system 250.

Because the integrity of poly-gate 150 is maintained through the protective function of the dielectric cap, the formation of activated source and drain regions 270 is and 272 is accomplished with greater latitude on the process parameters (e.g., radiation intensity, radiation pulse length, number of radiation pulses, radiation beam size, etc.) i.e., with a larger LTP process window than previously possible. The use of switch layer 320 provides even greater process latitude, i.e., an even larger process window.

Figure 2E:
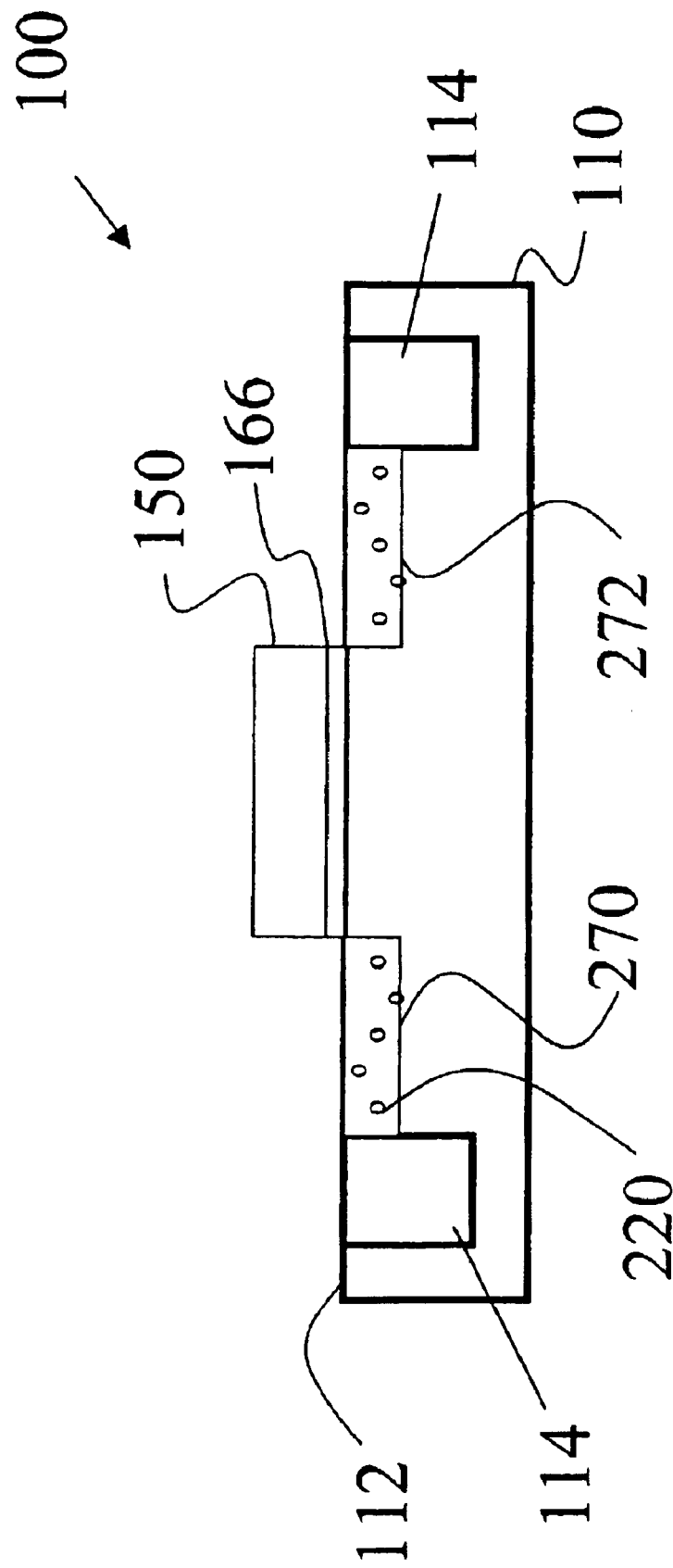
FIG. 2E shows an example resulting device in the form of a CMOSFET after the LTP system is removed.

With reference now to FIG. 2E, after irradiation LTP structure 250 is removed using standard CMOS processing techniques, e.g., etching and/or stripping. The result is a device 100, such as a CMOSFET as shown, with shallow, abrupt and low-resistance source and drain regions 270 and 272, along with an intact and undeformed poly-gate 150.

The above description is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention is defined by the appended claims, and includes the full scope of equivalents to which such claims are entitled.

What is claimed is:

1. A method of working a semiconductor structure with laser radiation wherein the semiconductor structure includes a substrate having a top surface with a portion of said top surface having formed thereon an oxide layer and a temperature-sensitive element on said oxide layer with edges of said oxide layer and temperature-sensitive element substantially in vertical alignment with each other, the method comprising the steps of:

forming a dielectric cap of a first thickness atop the temperature-sensitive element with edges of said dielectric cap substantially in vertical alignment with the edges of said temperature sensitive element and said oxide layer forming a three layer stack;

forming a conformal dielectric barrier layer of a second thickness on said substrate top surface and said three layer stack with the combined dielectric layers on said three layer stack having a thickness equal to the sum of said first and second thickness;

forming an absorber layer atop the conformal dielectric barrier layer; and irradiating the absorber layer with laser radiation to heat the absorber layer to a temperature sufficient to melt a region of the sum surface of the substrate with heat that passes through the second thickness of said conformal dielectric barrier layer and not melt said temperature-sensitive element with heat that passes through the sum of the first and second thickness of the combined dielectric layers wherein said conformal dielectric barrier layer in combination with said dielectric cap is disposed to insulate the temperature sensitive element from heat transmitted by the absorber layer.

2. The method of claim 1, wherein:

the laser radiation is delivered as laser thermal processing (LTP) for working the semiconductor structure;

the temperature sensitive element is a poly-gate; and the region of the top surface of the substrate includes unactivated doped amorphous source and drain regions.

3. The method of claim 2, wherein the dielectric cap is formed from a material selected from the group of materials consisting of: silicon oxide, silicon oxynitride, and silicon nitride.

4. The method of claim 2, wherein the dielectric cap first thickness is between 5 nm and 50 nm.

5. The method of claim 4, wherein the conformal dielectric layer second thickness is between 5 nm and 15 nm.

6. The method of claim 2, further includes the step of forming the dielectric cap to be capable of substantially preventing implanted particles from reaching the poly-gate when a particle implantation of the semiconductor structure is performed.

7. The method of claim 2, wherein the absorber layer is a metal layer.

8. The method of claim 2, further includes the step of forming a switch-layer atop the absorber layer.

9. The method of claim 8, wherein the switch layer is a reflectivity-switch layer.

10. The method of claim 8, wherein the switch layer is a phase-switch layer.

11. The method of claim 1, wherein the laser radiation is delivered as laser thermal processing (LTP) and the working of the semiconductor structure forms a semiconductor device.

12. The method of claim 11, wherein the temperature-sensitive element is formed from polysilicon.

13. The method of claim 12, wherein the polysilicon temperature sensitive element is a poly-gate.

14. The method of claim 12, wherein the dielectric cap substantially prevents implantation particles from passing therethrough and reaching the underlying polysilicon temperature-sensitive element.

15. The method of claim 11, wherein the dielectric cap first thickness is between 5 nm and 50 nm.

16. The method of claim 15, wherein the dielectric layer second thickness is between 5 nm and 15 nm.

17. The method of claim 11, wherein the dielectric cap is formed from a material selected from the group of materials consisting of: silicon oxide, silicon oxynitride, and silicon nitride.

18. The method of claim 11, wherein the absorber layer is a metal layer.

19. The method of claim 11, further includes the step of forming a switch layer atop the absorber layer.

20. The method of claim 19, wherein the switch layer is a reflectivity-switch layer.

21. The method of claim 19, wherein the switch layer is a phase-switch layer.

22. The method of claim 1, wherein said first thickness is 5 nm to 50 nm and said second thickness is 5 nm to 15 nm.

23. The method of claim 1, wherein said dielectric cap is disposed to prevent implant particles from passing therethrough to the temperature sensitive element.

24. A method of working a semiconductor structure with laser radiation wherein the semiconductor structure includes a substrate having a top surface with a portion of said top surface having formed thereon an oxide layer and a poly-gate on said oxide layer that is temperature sensitive with edges of said oxide layer and said poly-gate substantially in vertical alignment with each other:

the method comprising the steps of:

forming a dielectric cap of a first thickness atop the poly-gate with edges of said dielectric cap substantially in vertical alignment with the edges of said poly-gate and said oxide layer forming a three layer stack;

forming unactivated source and drain regions in the substrate;

forming a conformal dielectric barrier layer of a second thickness on said substrate top surface including on said unactivated source and drain regions, and said three layer stack with combined dielectric layers on said three layer stack having a thickness equal to the sum of said first and second thicknesses;

forming an absorber layer atop the conformal dielectric barrier layer;

forming a switch layer atop the absorber layer; and irradiating the switch layer with the laser radiation that passes through the switch layer to heat the absorber layer to a temperature sufficient to activate the unactivated source and drain regions with heat that passes through the second thickness of said conformal dielectric barrier layer and not melt to poly-gate with heat that passes through the sum of the first and second thickness of the combined dielectric layers wherein said conformal dielectric barrier layer in combination with said dielectric cap is disposed to insulate the poly-gate from the heat transmitted by the absorber layer;

wherein the source and drain regions, when activated using the laser radiation, together with the poly-gate forms a metal-oxide-semiconductor field-effect transistor (MOSFET) with the conformal dielectric barrier layer atop the source and drain regions.

25. The method of claim 24, wherein the dielectric cap first thickness is between 5 nm and 50 nm.

26. The method of claim 25, wherein the conformal dielectric layer second thickness is between 5 nm and 15 nm.

27. The meth of claim 24, wherein the dielectric cap is formed from a material selected from the group of materials consisting of: silicon oxide, silicon oxynitride, and silicon nitride.

28. The method of claim 24, wherein the absorber layer is a metal layer.

29. The method of claim 24, wherein the dielectric cap substantially prevents implanted particles from reaching the poly-gate when a particle implantation of the semiconductor structure is performed.

30. The method of claim 24 wherein the switch layer is a reflectivity-switch layer.

31. The method of claim 24 wherein the switch layer is a phase-switch layer.

* * * * *